United States Patent [19]
Heslop

[11] 3,961,989
[45] June 8, 1976

[54] METHOD OF MAKING IMPATT DIODE AND RESULTING DIODE

[75] Inventor: Christopher John Heslop, Pinner, England

[73] Assignee: The Post Office, London, England

[22] Filed: Feb. 4, 1975

[21] Appl. No.: 547,013

[30] Foreign Application Priority Data
Feb. 8, 1974 United Kingdom............... 5865/74

[52] U.S. Cl................................ 148/1.5; 148/175; 357/91
[51] Int. Cl.²....................................... H01L 21/263
[58] Field of Search...................... 148/1.5; 357/91

[56] References Cited
UNITED STATES PATENTS

| | | | |
|---|---|---|---|
| 3,509,428 | 4/1970 | Mankarious | 148/1.5 X |
| 3,595,716 | 7/1971 | Kerr et al. | 148/1.5 X |
| 3,730,778 | 5/1973 | Shannon et al. | 148/1.5 |
| 3,756,862 | 9/1973 | Ahn et al. | 148/1.5 |

OTHER PUBLICATIONS

Nelson et al., "Radiation–Enhanced Diffusion of Boron in Silicon," Appl. Phys. Let., vol. 15, No. 8, Oct. 15, 1969, pp. 246–248.

*Primary Examiner*—L. Dewayne Rutledge
*Assistant Examiner*—J. M. Davis
*Attorney, Agent, or Firm*—Kemon, Palmer & Estabrook

[57] ABSTRACT

An IMPATT diode is manufactured by doping a silicon n-type epitaxial layer and bombarding the doped layer with ions, preferably protons.

6 Claims, 2 Drawing Figures

METHOD OF MAKING IMPATT DIODE AND RESULTING DIODE

The present invention relates to a method of producing an IMPATT diode, and IMPATT diodes produced by the method.

A convenient form of high frequency oscillator consists of an IMPATT diode placed in a resonent cavity, with a suitable arrangement for coupling power out. Such impatt diodes utilising the "double drift" principle in which a reversed biased p-n junction is biased to break down so that the avalanche generated hole and electron pairs are allowed to drift in separate and equal regions, one for the holes and one for the electrons, have been made to operate in the frequency range 50 to 100 GHz. Such devices exhibit a negative terminal impedance and may thus be used as the active element in an oscillator. It is clearly desirable to extend the operating frequency of IMPATT diodes to higher frequencies, e.g. 150 to 200 GHz. In order to do this it is necessary to reduce the size of the drift space.

The concept of modifying dopant profiles in semiconductors by proton bombardment has been investigated by Minear, Nelson, and Gibbons, see Journal of Applied Physics Volume 43 No. 8 1972 page 3468. The profiles produced by this prior art technique, had controlled dopant concentration gradients. Devices produced by these techniques could be used as varactor diodes. The reported dopant profiles were not of a form suitable for use in IMPATT diodes.

The present invention seeks to provide a method by which the impurity concentration profile in a semi-conductor can be made to give a drift space of such a magnitude that IMPATT diode operation at frequencies up to 200 GHz is possible.

According to the invention there is provided a method of making an IMPATT diode comprising the steps of:

a. doping an n-type epitaxial layer of silicon grown on an $n^+$-type silicon substrate with boron.
b. bombarding said n-type epitaxial layer with ions.
Preferably said ions are protons.

According to a second aspect of the present invention there is provided an IMPATT diode made by the methods described in the previous two paragraphs.

An embodiment of the invention will now be described by way of example with reference to the accompanying drawings in which.

Figure 1:
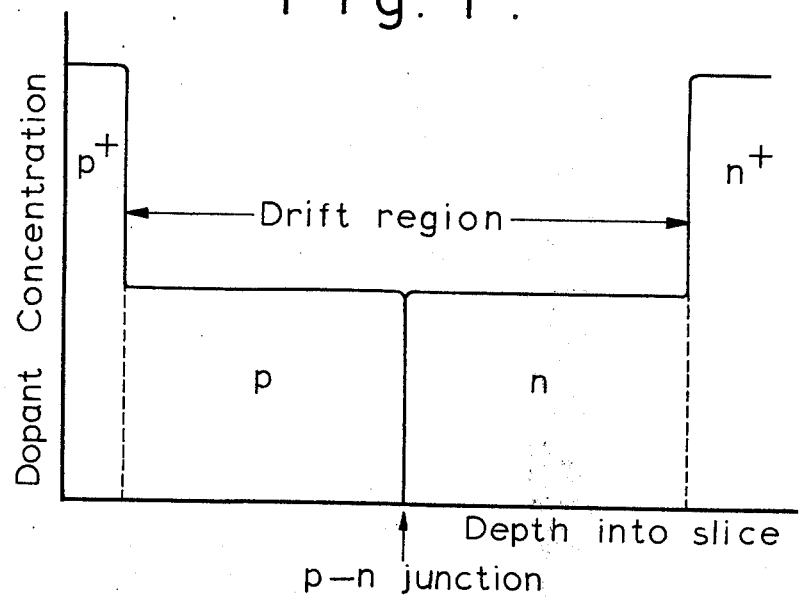
FIG. 1 shows an idealised doping profile for "double-drift" IMPATT diodes.

The ideal doping profile for an IMPATT diode is shown in FIG. 1. Either an $n^+$-n-p-$p^+$ or complementary $p^+$-p-n-$n^+$ profile can be used. It should be noted at this point that the terminology $n^+$, or $p^+$ is used to refer to a heavily doped semi-conductor, doped with either an n-type impurity or a p-type impurity, and $n$, or $p$, without a + is used to indicate moderate doping levels. The width of the n-p region is an important parameter in determining the frequency of operation. For operation at 150 GHz the drift space should have a width of 0.33 microns and a dopant concentration of 2.5 to 3.0 × $10^{17}$ atoms per cc. For operation at 200 GHz the drift space should have a width of 0.25–0.3 microns and a dopant concentration of 3.5 to 4.0 × $10^{17}$ atoms per cc.

Figure 2:
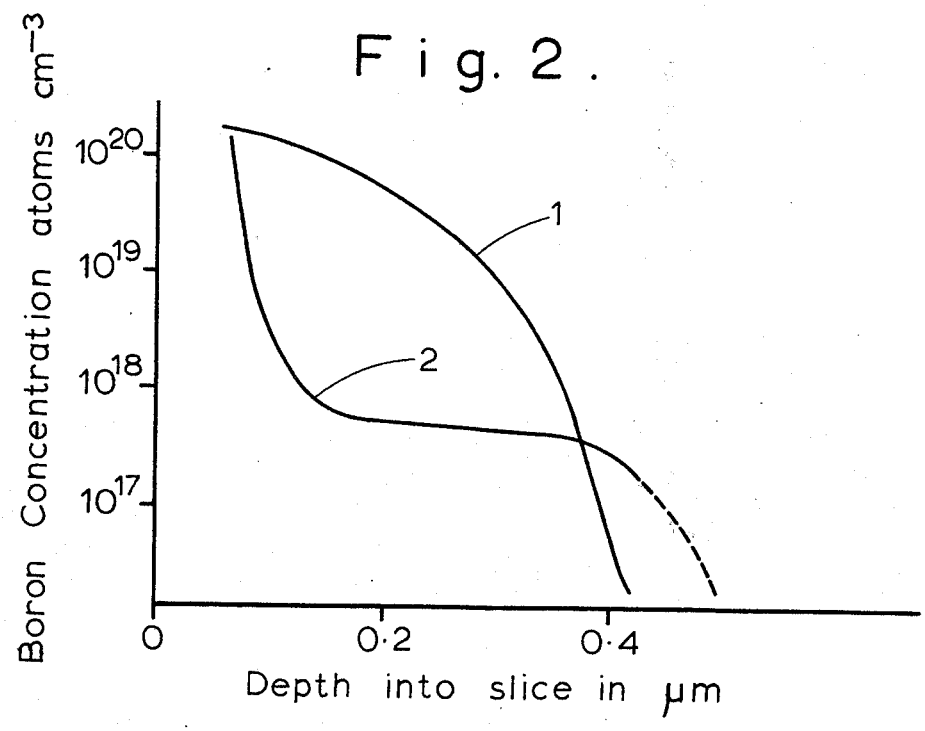
FIG. 2 shows a proton enhanced boron profile.

Attempts to fabricate such structures, using conventional techniques, have so far failed due to the inability to produce the correct doping profile. However by proton bombarding the semi-conductor surface after doping by either diffusion or ion implantation, the desired profile may be obtained. Curve 1 of FIG. 2 shows a typical impurity concentration profile produced by diffusion of boron into silicon. If the surface is held at a temperature of about 600°C and bombarded with approximately $10^{15}$ protons per square centimeter at an energy of 20 KeV, the impurity concentration profile of curve 2 is produced. This profile is extremely close to the idealised profile shown in FIG. 1.

The following procedure may be used to fabricate a "double-drift" IMPATT diode:

1. An n-type epitaxial layer of silicon formed on an $n^+$ substrate of silicon is subjected to boron ion implantation.

2. The surface of the epitaxial layer is subjected to proton bombardment while maintained at a temperature of about 600°C.

3. The resulting diode has connections made to it, and is encapsulated in the usual manner.

EXAMPLE 1

An IMPATT diode capable of operating at 100 GHz can be made using the above process providing the parameters listed below are used:

1. Thickness of epitaxial layer = 0.6 – 0.7 microns
2. Resistivity of epitaxial layer = 0.06 – 0.08 ohm-centimeter
3. Boron ion implantation consisting of a total dose of 10 micro coulombs $cm^{-2}$ of boron ions at an energy of 15 KeV.
4. Proton energy sufficient to produce penetration into the epitaxial layer to a depth of 0.1 to 0.15 microns.
5. Total dose of proton = 55 – 65 micro coulombs $cm^{-2}$ at a beam current of 0.1 micro amps. It should be noted that the energy of the protons referred to above corresponds approximately in the absence of an oxide layer on the surface of the epitaxial layer to a proton energy of 10 KeV.

EXAMPLE 2

An IMPATT diode capable of operating at 200 GHz can be made by the above method if the following parameters are employed:

1. Thickness of epitaxial layer = 0.4 – 0.5 microns.
2. Resistivity of epitaxial layer = 0.04 – 0.05 ohms centimeters.
3. Boron ion implantation to give a total dose of 15 micro coulombs $cm^{-2}$ at an energy of 15 KeV.
4. Proton bombardment with protons having an energy sufficient to produce penetration of the epitaxial layer to a depth of between 0.1 and 0.15 microns.
5. Total dose of proton bombardment equal to 40–50 micro coulombs $cm^{-2}$ at a beam current of 0.1 micro amps.

The exact mechanism by which proton bombardment produces the required profile is not fully understood. It is probable that impurity atoms are trapped interstitially, to create an electrically active profile differing considerably from the true impurity profile. Because of this the term impurity concentration profile is to be interpreted as referring to the electronically effective impurity concentration profile, i.e. only to those impurity ions which modify the electronic properties of the semi conductor.

Since it is believed that the proton bombardment acts by virtue of radiation damage, it is believed that other ions, e.g. alpha particles or deuterons could be used to modify the impurity profile in the same way as proton bombardment, provided that the ions do not dope the semi-conductor.

What we claim is:

1. A method of making an IMPATT diode comprising the steps of:
    a. doping an n-type epitaxial layer of silicon grown on an n$^+$-type silicon substance with boron; and then
    b. bombarding said layer with ions while maintaining its temperature between 590°C and 610°C.

2. A method as claimed in claim 1 wherein said ions are protons.

3. A method as claimed in claim 2 wherein said protons penetrate said epitaxial layer to a depth of 0.1 – 0.15 microns.

4. A method as claimed in claim 2 wherein said epitaxial layer receives a total proton dose of 40–65 micro coulombs cm$^{-2}$ at a beam current of 0.09 – 0.11 micro amps.

5. A method as claimed in claim 1 wherein boron is implanted into said n-type epitaxial layer by ion implantation.

6. An IMPATT diode made by the method claimed in claim 1.

* * * * *